(12) United States Patent
He et al.

(10) Patent No.: US 10,539,613 B2
(45) Date of Patent: Jan. 21, 2020

(54) ANALOG CIRCUIT FAULT DIAGNOSIS METHOD USING SINGLE TESTABLE NODE

(71) Applicant: HEFEI UNIVERSITY OF TECHNOLOGY, Anhui (CN)

(72) Inventors: Yigang He, Anhui (CN); Lifen Yuan, Anhui (CN); Lei Wu, Anhui (CN); Yesheng Sun, Anhui (CN); Chaolong Zhang, Anhui (CN); Ying Long, Anhui (CN); Zhen Cheng, Anhui (CN); Zhijie Yuan, Anhui (CN); Deqin Zhao, Anhui (CN)

(73) Assignee: HEFEI UNIVERSITY OF TECHNOLOGY, Anhui (CN)

( * ) Notice: Subject to any disclaimer, the term of this patent is extended or adjusted under 35 U.S.C. 154(b) by 154 days.

(21) Appl. No.: 15/555,076

(22) PCT Filed: Nov. 25, 2015

(86) PCT No.: PCT/CN2015/095475
§ 371 (c)(1),
(2) Date: Sep. 1, 2017

(87) PCT Pub. No.: WO2017/024692
PCT Pub. Date: Feb. 16, 2017

(65) Prior Publication Data
US 2018/0038909 A1    Feb. 8, 2018

(30) Foreign Application Priority Data
Aug. 7, 2015  (CN) .......................... 2015 1 0482994

(51) Int. Cl.
*G01R 31/316*      (2006.01)
*G01R 31/3161*     (2006.01)

(52) U.S. Cl.
CPC ....... *G01R 31/316* (2013.01); *G01R 31/3161* (2013.01)

(58) Field of Classification Search
CPC .......................... G01R 31/316; G01R 31/3161
See application file for complete search history.

(56) References Cited

U.S. PATENT DOCUMENTS

| 5,469,120 A | 11/1995 | Nguyen et al. | |
|---|---|---|---|
| 6,031,386 A * | 2/2000 | Cole, Jr. ............ | G01R 31/3004 324/762.02 |

(Continued)

FOREIGN PATENT DOCUMENTS

| CN | 101246200 | 8/2008 |
|---|---|---|
| CN | 102520341 | 6/2012 |

(Continued)

OTHER PUBLICATIONS

"International Search Report (Form PCT/ISA/210) of PCT/CN2015/095475", dated May 18, 2016, with English translation thereof, pp. 1-4.

*Primary Examiner* — Manuel A Rivera Vargas
*Assistant Examiner* — Yaritza H Perez Bermudez
(74) *Attorney, Agent, or Firm* — JCIPRNET

(57) ABSTRACT

An analog circuit fault diagnosis method using a single testable node comprises the following steps: (1) obtaining prior sample data vectors under each fault mode; (2) computing a statistical average of the prior sample data vectors under each of the fault modes; (3) decomposing a signal by an orthogonal Haar wavelet filter set; (4) extracting the feature factor of the prior sample fault modes; (5) extracting a fault-mode-to-be-tested feature factor; (6) computing a correlation coefficient matrix and correlation metric parameters between the feature factor of the prior sample fault modes and the feature factor of the fault-mode-to-be-tested; and (7) determining a fault mode according to a maximal (Continued)

correlation principle by comparing the correlation metric parameters. The method can convert a single signal into a plurality of signals without losing original measurement information, and extract an independent fault mode feature factor reflecting variations of a circuit structure in different fault modes, can be used to study an associated mode determination rule and successfully complete classification of circuit fault modes.

5 Claims, 5 Drawing Sheets

(56) References Cited

U.S. PATENT DOCUMENTS

| | | | |
|---|---|---|---|
| 6,621,299 B1 | 9/2003 | Randazzo et al. | |
| 2004/0230385 A1* | 11/2004 | Bechhoefer | G01R 31/11 702/57 |
| 2004/0230387 A1* | 11/2004 | Bechhoefer | G01R 31/11 702/58 |

FOREIGN PATENT DOCUMENTS

| | | |
|---|---|---|
| CN | 103439647 | 12/2013 |
| CN | 104198924 | 12/2014 |
| CN | 105044590 | 11/2015 |

* cited by examiner

ANALOG CIRCUIT FAULT DIAGNOSIS METHOD USING SINGLE TESTABLE NODE

CROSS-REFERENCE TO RELATED APPLICATION

This application is a 371 application of the International PCT application serial no. PCT/CN2015/095475, filed on Nov. 25, 2015, which claims the priority benefit of China application no. 201510482994.X, filed on Aug. 7, 2015. The entirety of each of the abovementioned patent applications is hereby incorporated by reference herein and made a part of this specification.

TECHNICAL FIELD

The present invention relates to an analog circuit fault diagnosis method using a single testable node.

BACKGROUND

Analog circuit fault diagnosis is equivalent to mode recognition in essence, and the key is to seek a relationship between feature extraction and mode criterion function. Therefore, how to seek potential fault feature factors from seemingly complicated test data and conduct correct judgment and recognition on the fault mode on this basis is deemed as a significant research subject in the field of analog circuit testing.

Through development of the analog circuit fault diagnosis over the past decade, the achievement which has been achieved is varied and shows diversity, and the new research results continually come out. To summarize the technologies adopted in fault diagnosis, a fault feature extracting method based on statistical theory and wavelet analysis, and a fault mode recognition method based on neural network and support vector machine are widely applied at present. These aspects have great impact on promoting the development of the analog circuit fault diagnosis technologies. However, the analog circuit fault diagnosis technologies are still in development so far due to the large knowledge scope of analog circuit fault diagnosis design, deficiency of fault models and the binding character of the methods thereof.

Because the measurable nodes of the analog circuit are limited, and only one node at an output terminal serves as the measurable node under most circumstances. The test data collected under this case are usually mixed data of various independent sources, and the feature factors thereof are implied deeply. When diagnosing these circuits, a very expensive amount of computations for classification is caused usually if the original data collected is directly fed to a classifier for classification, which is difficult to implement, and also has poor classification effect, and high erroneous judgment ratio. Independent factors from system bottom are not single; moreover, these are invisible independent sources (i.e., blind sources) for a ten final user. A technology regarding blind source processing at current is mainly applied to the field of voice recognition, and its application prerequisite is multi-channel measured data source. Therefore, extracting the feature factors of the circuit measured with using a single testable node cannot be directly implemented by a blind source separation technology.

SUMMARY

A technical problem to be solved by the present invention is to provide an analog circuit fault diagnosis method using a single testable node with low misjudgment ratio so as to overcome the above defects of the prior art.

The essence of the analog circuit fault diagnosis method using a single testable node according to the present invention is to convert a single testable node signal into a plurality of signals by using an orthogonal wavelet analysis filter set, so as to extract fault features via using a blind source separation technology, and estimate a fault-mode-to-be-tested of a specific circuit node based on correlation metric parameters by computing a correlation coefficient matrix between the specific node independent fault-mode-to-be-tested feature of the circuit and a known independent sample fault feature. Known from statistics knowledge, the larger the correlation coefficient of two random vectors is, then the larger the correlation of the two random vectors is, i.e., the higher the similarity of the two random vectors is. In an allowable error scope, we take one approximation to approximately deem the fault mode of the known sample as the fault-mode-to-be-tested.

A technical solution to be adopted by the present invention to solve the technical problems thereof is as follows:

An analog circuit fault diagnosis method using a single testable node comprises the following steps:

(1) obtaining prior sample data vectors under each of fault modes: obtaining M groups of voltage sample vectors $V_{ij}$ of an analog circuit under test under each of fault modes $F_i$ by using computer simulation software, wherein i=1, 2, ..., N, j=1, 2, 3, ..., M, N is a total number of the fault modes of the circuit, i represents that the circuit works under a $i^{th}$ fault mode, j is a $j^{th}$ collected samples, and $V_{ij}$ represents a $j^{th}$ voltage sample vector collected when the circuit works under the $i^{th}$ fault mode;

(2) computing a statistical average $$V_i = \sum_{j=1}^{M} V_{ij}/M$$

of the prior sample data vectors under each of the fault modes, wherein i=1, 2, ..., N, and $V_i$ is voltage sample statistical average vectors when the circuit works under the fault modes $F_i$;

(3) decomposing a signal by an orthogonal Haar wavelet filter set: decomposing the voltage sample statistical average vectors $V_i$ (i=1, 2, ..., N) under each of the fault modes into (K+1) filter output signals by a K-layer orthogonal Haar wavelet filter set;

(4) extracting feature factors of prior sample fault modes: extracting (K+1) feature factors $s_{i,d}$ of the prior sample fault modes through processing the (K+1) filter output signals under the fault modes $F_i$ by using a blind source processing technology, wherein d represents a serial number of fault feature factors, and d=1, 2, ..., K+1, and $s_{i,d}$ represents a $d^{th}$ feature factor of the prior sample fault modes of a voltage sample signal under the fault mode $F_i$;

(5) extracting feature factors of a fault-mode-to-be-tested: collecting M groups of voltage testable vectors under the fault-mode-to-be-tested, computing a statistical average of the voltage testable vectors, decomposing by the orthogonal Haar wavelet filter set in the step (3), and obtaining (K+1) feature factors $s_{T,j}$ of the voltage testable vectors under the fault-mode-to-be-tested through the blind source processing technology in step (4), wherein T represents to-be-tested, which is the first letter of Test, and is intended to distinguish the fault-mode-to-be-tested and the prior fault modes; h represents a serial number of the feature factors, h=1, 2, ..., K+1, and $s_{T,h}$ represents a $h^{th}$ feature factor of a voltage testable signal under the fault-mode-to-be-tested;

(6) computing a correlation coefficient matrix $R_i$ and correlation metric parameters $\delta_i$ between the feature factors of the fault-mode-to-be-tested and the feature factors of the prior sample fault modes of all the fault modes $F_i$ (i=1, 2, ..., N);

$$R_i = \begin{bmatrix} \rho_{11} & \rho_{12} & \cdots & \rho_{1(K+1)} \\ \rho_{21} & \rho_{22} & \cdots & \rho_{2(K+1)} \\ \vdots & \vdots & \vdots & \vdots \\ \rho_{(K+1)1} & \rho_{(K+1)2} & \cdots & \rho_{(K+1)(K+1)} \end{bmatrix},$$

$$\delta_i = \sum_{h=1}^{K+1} \left( \max_d (\rho_{hd}) \right),$$

wherein $\rho_{hd}=E((s_{T,h}-E(s_{T,h}))\cdot(s_{i,d}))$, i=1, 2, ..., $E(\bullet)$ represents to determine an expected value, $s_{T,h}$ (h=1, 2, ..., K+1) represents the $h^{th}$ feature factor of the voltage testable signal under the fault-mode-to-be-tested, $s_{i,d}$ (d=1, 2, ..., K+1) represents the $d^{th}$ feature factor of the prior sample fault modes of the voltage sample signal under the fault mode $F_i$, the physical meaning of $\rho_{hd}$ is a correlation coefficient between the $h^{th}$ feature factor of the voltage testable signal under the fault-mode-to-be-tested and the $d^{th}$ feature factor of the prior sample fault modes of the voltage sample signal under the fault mode $F_i$;

$$\max_d (\rho_{hd})$$

represents the maximum $\rho_{hd}$ when h is constant and d=1, 2, ..., (K+1); and (7) comparing all the $\delta_i$, and determining a $k^{th}$ fault mode if $$k = \text{Index}\left( \max_i (\delta_i) \right),$$

wherein i=1, 2, ..., N, and Index($\bullet$) represents to calculate an index.

Further, a feature of the K-layer orthogonal Haar wavelet analysis filter set in the step (3) is that each of the layers of the filter set consists of a low-pass filter g(n) and a high-pass filter h(n), output portion of the high-pass filter h(n) is subjected to double downsampling to enter next layer of the wavelet filter set, and output of the low-pass filter g(n) at each layer is subjected to double downsampling and then outputted directly, the low-pass filter g(n)={$1/\sqrt{2}$, $1/\sqrt{2}$}, and the high-pass filter h(n)={$1/\sqrt{2}$, $-1/\sqrt{2}$}.

Further, a method of determining a layer number K of the K-layer orthogonal Haar wavelet analysis filter set in the step (3) is: setting an input signal of the filter set as x, and the outputs of the high-pass filter h(n) and the low-pass filter g(n) at the layer K as $y_{K,H}$ and $y_{K,L}$ respectively, then steps of determining the K value are as follows:

(3.1) initializing: K=1, $\beta_0$=Th, wherein K is the layer number of filters, $\beta_0$ is an energy ratio threshold, and Th is a preset original value of the energy ratio threshold which can be any real number greater than 0 but less than 1;

(3.2) computing the energy ratio $$\beta = \frac{\langle y_{K,H}, y_{K,H} \rangle}{\langle x, x \rangle},$$

wherein <,> represents to compute an inner product; and (3.3) if $\beta > \beta_0$, then K=K+1, returning to execute the step (3.2); otherwise, outputting the layer number of filters K.

Further, a method of extracting the feature factor by using a blind source processing technology in the step (4) is: setting a signal matrix needing to be processed by the blind source technology as $Y_i$, wherein an extracted feature factor matrix is $S_i=[s_{i,1}\ s_{i,2}\ \ldots\ s_{i,d}\ \ldots\ s_{i,(K+1)}]$, $s_{i,d}$ represents the $d^{th}$ feature factor of the prior sample fault of the voltage sample signal under the fault mode $F_i$; and the dimensionalities of $Y_i$ and $S_i$ are equal;

(4.1) initializing a feature extracting matrix $W_0$ and an update step-length $\mu$, and letting $W_1 \leftarrow W_0$, wherein "←" represents to assign the value of $W_0$ to $W_1$, $W_0$ is any unit matrix, and $\mu$ is a real number between (0, 0.3);

(4.2) computing: $S_i=W_0 Y_i$;

(4.3) updating $W_1$: $W_i \leftarrow W_0 + \mu[I-f[S_i]]g^T[S_i]$, wherein forms of functions f($\bullet$) and g($\bullet$) herein are respectively $f[S_i]=S_i$ and $g[S_i]=S_i^3$, $g^T(\bullet)$ represents matrix transposition; and I represents a standard unit matrix;

(4.4) standardizing $W_1$:

$$W_1 \leftarrow \frac{W_1}{\|W_1\|},$$

wherein $\|\bullet\|$ represents a matrix norm, $$\frac{W_1}{\|W_1\|}$$

represents to standardize $W_1$, and "←" represents to standardize $W_1$ and then assign a value to $W_1$; and (4.5) determining convergence: determining whether $W_1 W_1^T \to I$, i.e., determining whether a product of $W_1 W_1^T$ is infinitely approaching to I, "→" represents "infinitely approaching"; if yes, then outputting $S_i$; otherwise, $W_0 \leftarrow W_1$, wherein "←" represents assigning, and returning to the step (4.2); and I represents a standard unit matrix.

The present invention can convert a single signal into a plurality of signals without losing original measurement information, and extract an independent fault mode feature factor reflecting variations of a circuit structure in different fault modes, can be used to study an associated mode determination rule and successfully complete classification of circuit fault modes.

DETAILED DESCRIPTION

The invention is explained in details hereinafter with reference to the drawings.

Figure 1A:
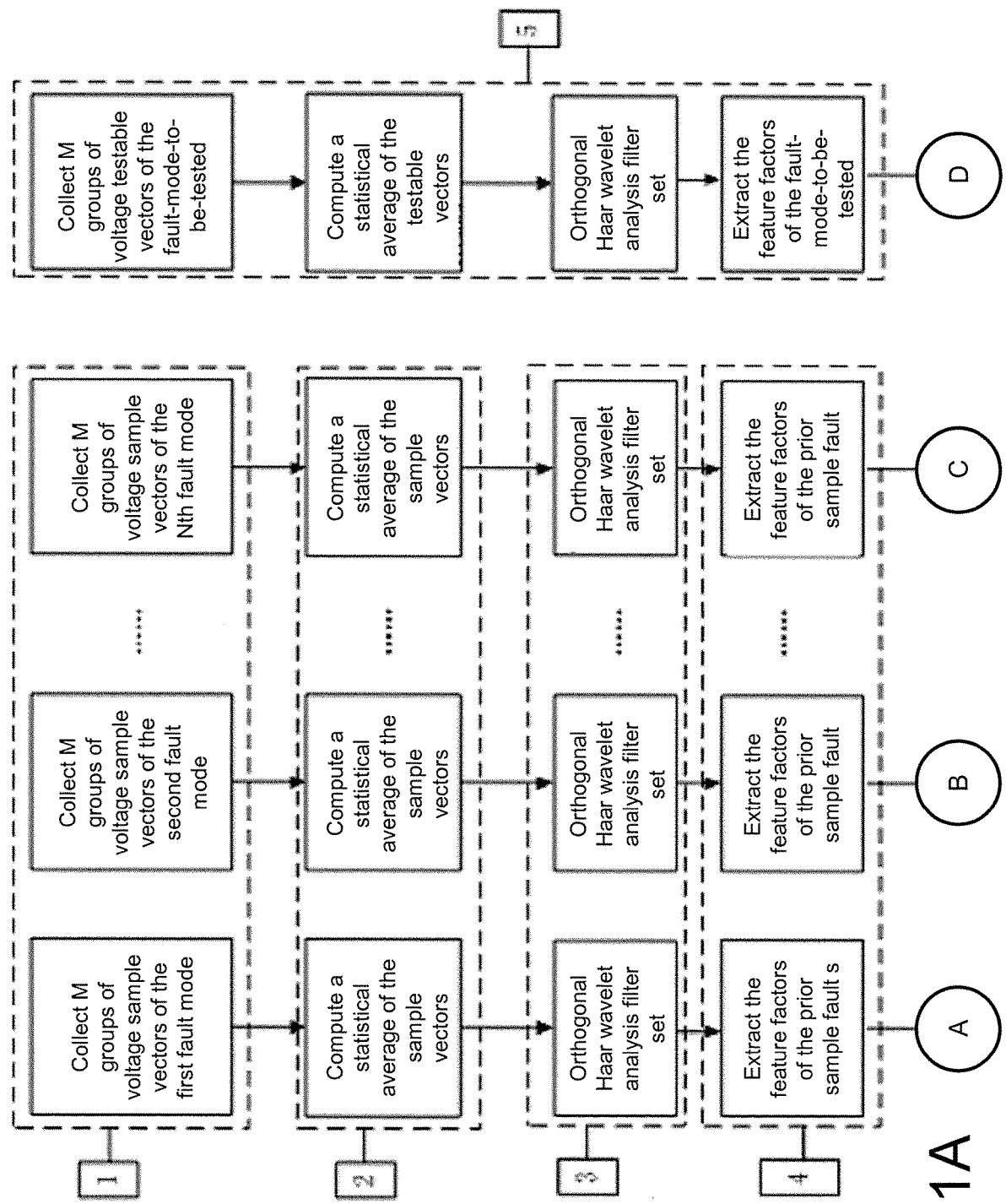
FIG. 1A and FIG. 1B are block diagrams of an analog circuit fault diagnosis method using a single testable node.
Figure 1B:
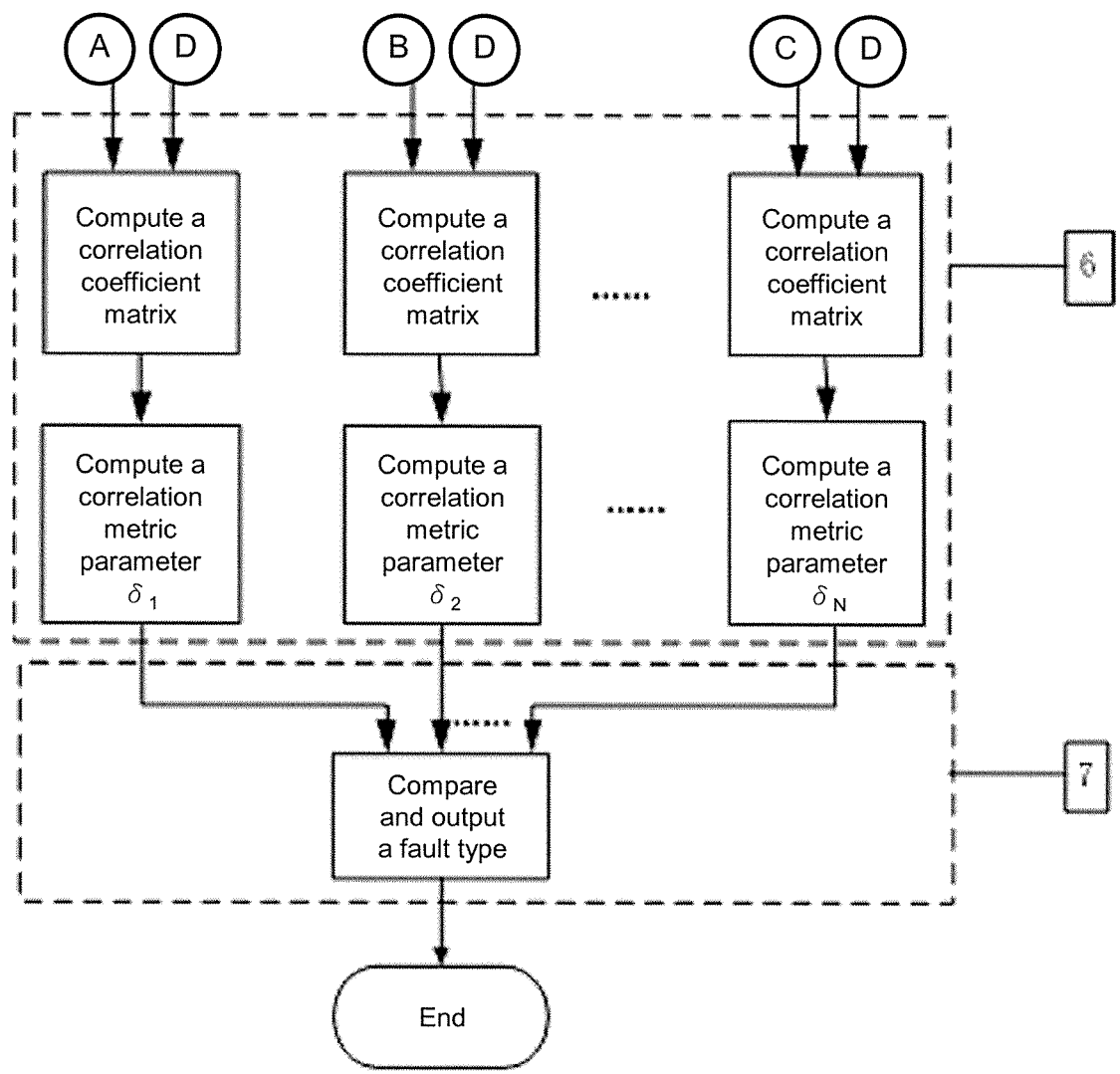

Referring to FIG. 1A and FIG. 1B, an analog circuit fault diagnosis method using a single testable node comprises the following steps:

(1) obtaining prior sample data vectors under each fault mode: obtaining M groups of voltage sample vectors $V_{ij}$ of an analog circuit under test under each of fault modes $F_i$ by using computer simulation software, wherein i=1, 2, ..., N, j=1, 2, 3, ..., M, N is a total number of the fault modes of the circuit, i represents that the circuit works under a $i^{th}$ fault mode, j is a $j^{th}$ collected samples, and $V_{ij}$ represents a $j^{th}$ voltage sample vector collected when the circuit works under the $i^{th}$ fault mode; in FIG. 1A and FIG. 1B, it is expressed as: collecting M groups of the voltage sample vectors under the first type fault mode, collecting M groups of the voltage sample vectors under the second type fault mode, ..., and collecting M groups of the voltage sample vectors under the $N^{th}$ type fault mode;

(2) computing a statistical average $$V_i = \sum_{j=1}^{M} V_{ij}/M$$

of the prior sample data vectors under each of the fault modes, wherein i=1, 2, ..., N, and $V_i$ is voltage sample statistical average vectors of the voltage sample when the circuit works under the fault modes $F_i$;

(3) decomposing a signal by an orthogonal Haar wavelet analysis filter set: decomposing the voltage sample statistical average vector $V_i$ (i=1, 2, ..., N) under each of the fault modes into (K+1) filter output signals by a K-layer orthogonal Haar wavelet filter set;

(4) extracting feature factors of prior sample fault modes: extracting (K+1) feature factors $s_{i,d}$ of the prior sample fault modes through processing the (K+1) filter output signals under the fault modes Fi by using the blind source processing technology under the fault mode $F_i$, wherein d represents a serial number of fault feature factors, and d=1, 2, ..., K+1, and $s_{i,d}$ represents a $d^{th}$ feature factor of the prior sample fault modes of a voltage sample signal under the fault mode $F_i$;

(5) extracting feature factors of a fault-mode-to-be-tested: collecting M groups of voltage testable vectors under the fault-mode-to-be-tested, computing a statistical average of the voltage testable vectors, decomposing by the orthogonal Haar wavelet filter set in the step (3), and obtaining (K+1) feature factors $s_{T,h}$ of the voltage testable vectors under the fault-mode-to-be-tested through the blind source processing technology in step (4), wherein T represents to-be-tested, which is the first letter of Test, and is intended to distinguish the fault-mode-to-be-tested and the prior fault modes; h represents a serial number of the feature factors, h=1, 2, ..., K+1, and $s_{T,h}$ represents a $h^{th}$ feature factor of a voltage testable signal under the fault-mode-to-be-tested;

(6) computing a correlation coefficient matrix $R_i$ and correlation metric parameters $\delta_i$ between the feature factor of the fault-mode-to-be-tested and the feature factor of the prior sample fault modes of all the fault modes $F_i$ (i=1, 2, ..., N);

$$R_i = \begin{bmatrix} \rho_{11} & \rho_{12} & \cdots & \rho_{1(K+1)} \\ \rho_{21} & \rho_{22} & \cdots & \rho_{2(K+1)} \\ \vdots & \vdots & \vdots & \vdots \\ \rho_{(K+1)1} & \rho_{(K+1)2} & \cdots & \rho_{(K+1)(K+1)} \end{bmatrix},$$

$$\delta_i = \sum_{h=1}^{K+1} \left( \underset{d}{\text{Max}}(\rho_{hd}) \right)$$

wherein $\rho_{hd}=E((s_{T,h}-E(s_{T,h}))\cdot(s_{i,d}-E(s_{i,d})))$, i=1, 2, ..., N, E(•) represents to determine an expected value, $s_{T,h}$ (h=1, 2, ..., K+1) represents the $h^{th}$ feature factor of the voltage testable signal under the fault-mode-to-be-tested, $s_{i,d}$ (d=1, 2, ..., K+1) represents the $d^{th}$ feature factor of the prior sample fault modes of the voltage sample signal under the fault mode $F_i$, the physical meaning of $\rho_{hd}$ is a correlation coefficient between the $h^{th}$ feature factor of the voltage testable signal under the fault-mode-to-be-tested and the $d^{th}$ feature factor of the prior sample fault modes of the voltage sample signal under the prior fault mode $F_i$, $$\underset{d}{\text{Max}}(\rho_{hd})$$

represents the maximum $\rho_{hd}$ when h is constant and d=1, 2, ..., (K+1); and (7) comparing all the $\delta_i$, and determining a $k^{th}$ fault mode if $$k = \text{Index}\left( \underset{i}{\text{Max}}(\delta_i) \right),$$

wherein i=1, 2, ..., N, and Index(•) represents to calculate an index.

Figure 2:
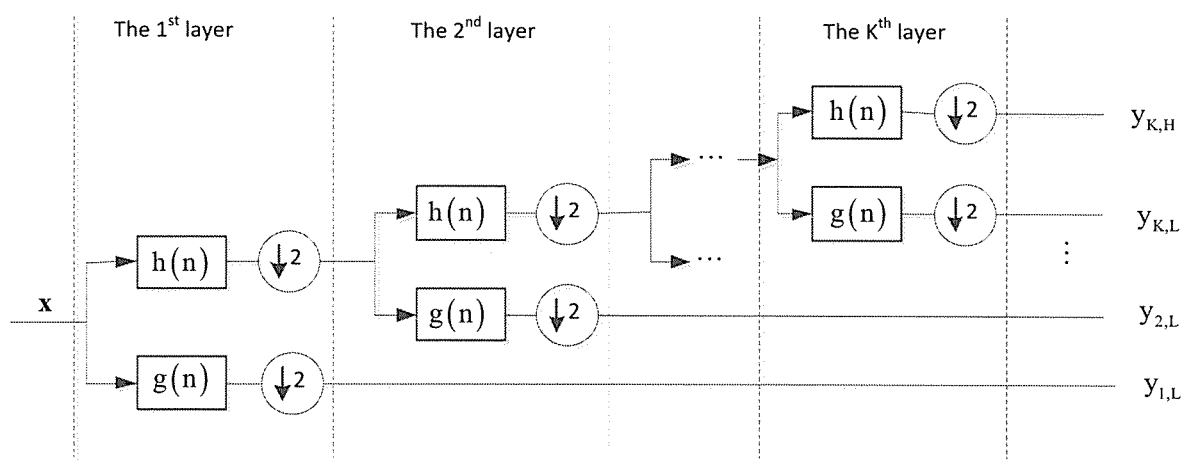
FIG. 2 is a structural diagram of a wavelet filter set.

Referring to FIG. 2, a feature of the K-layer orthogonal Haar wavelet analysis filter set in the step (3) is that each of the layers of the filter set consists of a low-pass filter g(n) and a high-pass filter h(n), output portion of the high-pass filter h(n) is subjected to double downsampling to enter next layer of wavelet filter set, and the output of the low-pass filter g(n) at each layer is subjected to double downsampling and then outputted directly, the low-pass filter g(n)={$1/\sqrt{2}$, $1/\sqrt{2}$}, and the high-pass filter h(n)={$1/\sqrt{2}$, $-1/\sqrt{2}$}. In FIG. 2, $y_{cL}$ (c=1, 2, ..., K) represents the output of a low pass filter at a $c^{th}$ layer of the filter set, subscript c represents the serial number of the filter layer of the filter, L represents low-pass; $y_{KH}$ represents output of a high-pass filter at a $k^{th}$ layer of the filter set, subscript K represents the serial number of the filter layer of the filter, and H represents high-pass.

Figure 3:
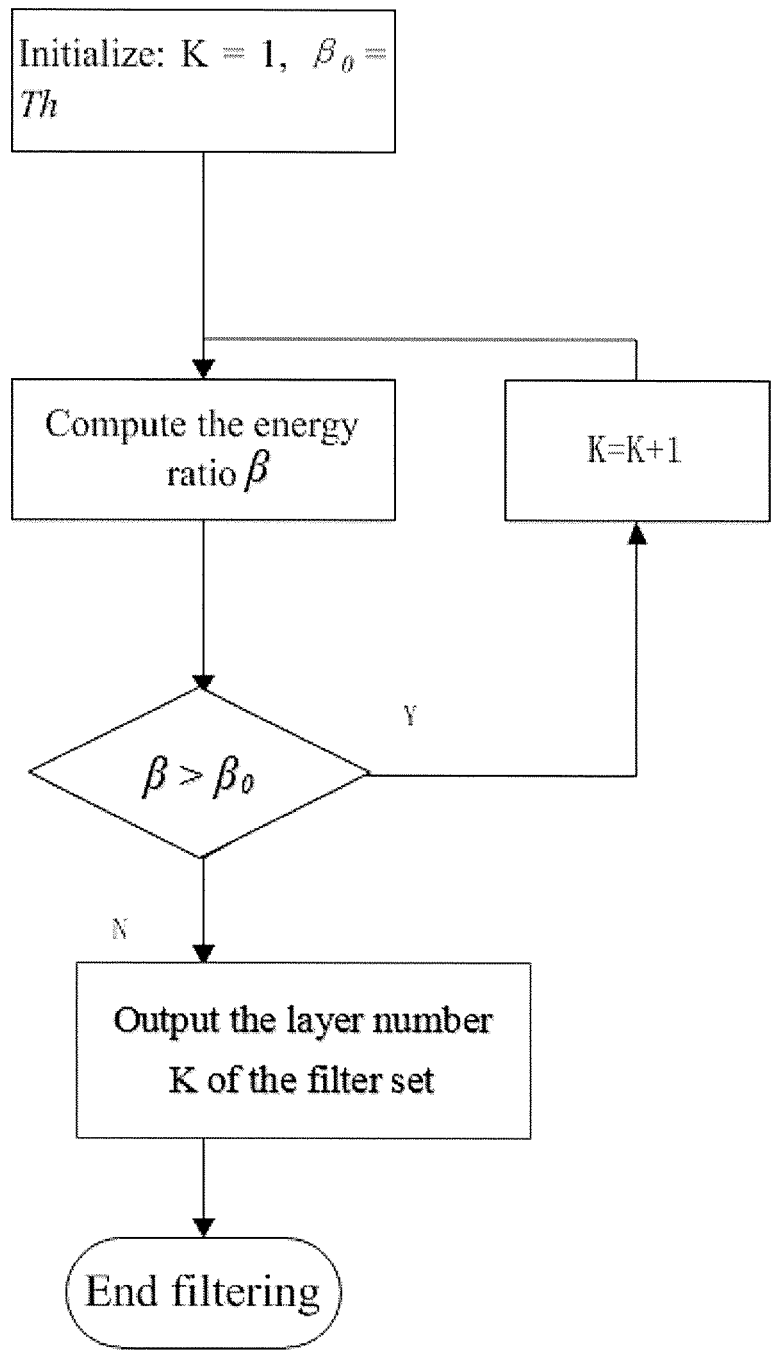
FIG. 3 is a flow of determining a layer number of the filter set.

Referring to FIG. 3, a method of determining a layer number K of the K-layer orthogonal Haar wavelet analysis filter set in the step (3) is: setting an input signal of the filter set as x, and the outputs of the high-pass filter h(n) and the low-pass filter g(n) at the layer K as $y_{K,H}$ and $y_{K,L}$ respectively, then steps of determining the K value are as follows:

(3.1) initializing: K=1, $\beta_0$=Th, wherein K is the layer number of filters, $\beta_0$ is an energy ratio threshold, and Th is a preset original value of the energy ratio threshold which can be any real number greater than 0 but less than 1;

(3.2) computing the energy ratio $$\beta = \frac{\langle y_{K,H}, y_{K,H} \rangle}{\langle x, x \rangle},$$

wherein <,> represents to compute an inner product; and (3.3) if $\beta > \beta_0$, then K=K+1, returning to execute the step (3.2); otherwise, outputting the layer number of filters K.

Figure 4:
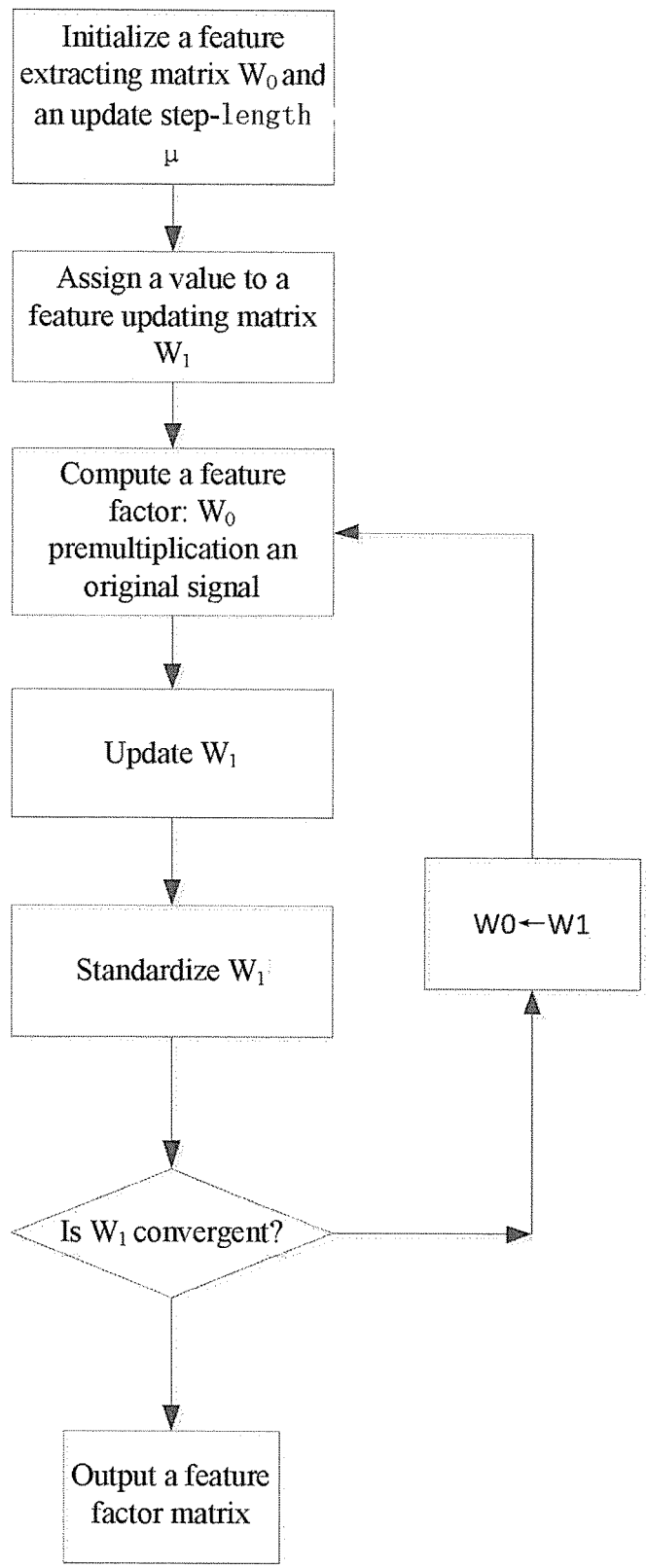
FIG. 4 is a flow of extracting a feature factor using a single testable node.

Referring to FIG. 4, a method of extracting the feature factor using a blind source processing technology in the step (4) is: setting a signal matrix needing to be processed by the blind source technology as $Y_i$, wherein an extracted feature factor matrix is $S_i=[s_{i,1}\ s_{i,2}\ \ldots\ s_{i,d}\ \ldots\ s_{i,(K+1)}]$, $s_{i,d}$ represents the $d^{th}$ feature factor of the prior sample fault of the voltage sample signal under the fault mode $F_i$; and the dimensionalities of $Y_i$ and $S_i$ are equal;

(4.1) initializing a feature extracting matrix $W_0$ and an update step-length $\mu$, and letting $W_1 \leftarrow W_0$, wherein "←" represents to assign the value of $W_0$ to $W_1$, $W_0$ is any unit matrix, and $\mu$ is a real number between (0, 0.3);

(4.2) computing: $S_i = W_0 Y_i$;

(4.3) updating $W_1$: $W_1 \leftarrow W_0 + \mu[I - f[S_i]]g^T[S_i]$, wherein forms of functions $f(\bullet)$ and $g(\bullet)$ herein are respectively $f[S_i]=S_i$ and $g[S_i]=S_i^3$, $g^T(\bullet)$ represents matrix transposition; and I represents a standard unit matrix;

(4.4) standardizing $W_1$:

$$W_1 \leftarrow \frac{W_1}{\|W_1\|},$$

wherein $\|\bullet\|$ represents a matrix norm $$\frac{W_1}{\|W_1\|}$$

represents to standardize $W_1$, and "←" represents to standardize $W_1$ and then assign a value to $W_1$; and (4.5) determining convergence: determining whether $W_1 W_1^T \to I$, i.e., determining whether a product of $W_1 W_1^T$ is infinitely approaching to I, "→" represents "infinitely approaching"; if yes, then outputting $S_i$; otherwise, $W_0 \leftarrow W_1$, wherein "←" represents assigning, and returning to the step (4.2); and I represents a standard unit matrix.

What is claimed is:

1. An analog circuit fault diagnosis method using a single testable node, comprising:

(1) obtaining prior sample data vectors under each of fault modes: obtaining M groups of voltage sample vectors $V_{ij}$ of an analog circuit under test under each of the fault modes $F_i$ by using computer simulation software, wherein $i=1, 2, \ldots, N$, $j=1, 2, 3, \ldots, M$, N is a total number of the fault modes of the circuit, i represents that the circuit works under a $i^{th}$ fault mode, j is a $j^{th}$ collected sample, and $V_{ij}$ represents a $j^{th}$ voltage sample vector collected when the circuit works under a $i^{th}$ fault mode;

(2) computing a statistical average $$V_i = \sum_{j=1}^{M} V_{ij}/M$$

of the prior sample data vectors under each of the fault modes, wherein $i=1, 2, \ldots, N$, and $V_i$ is voltage sample statistical average vectors when the circuit works under the fault modes $F_i$;

(3) decomposing a signal by an orthogonal Haar wavelet analysis filter set: decomposing the voltage sample statistical average vectors $V_i$ under each of the fault modes into (K+1) filter output signals by a K-layer orthogonal Haar wavelet filter set;

(4) extracting feature factors of prior sample fault modes: extracting (K+1) feature factors $s_{i,d}$ of the prior sample fault modes through processing the (K+1) filter output signals under the fault modes $F_i$ by using a blind source processing technology, wherein d represents a serial number of fault feature factors, and $d=1, 2, \ldots, K+1$, and $s_{i,d}$ represents a $d^{th}$ feature factor of the prior sample fault modes of a voltage sample signal under the fault mode $F_i$;

(5) extracting feature factors of a fault-mode-to-be-tested: collecting M groups of voltage testable vectors of the analog circuit under the fault-mode-to-be-tested, computing a statistical average of the voltage testable vectors, decomposing by the orthogonal Haar wavelet filter set in the step (3), and obtaining (K+1) feature factors $s_{T,h}$ of the voltage testable vectors under the fault-mode-to-be-tested through the blind source processing technology in step (4), wherein T represents to-be-tested, which is the first letter of Test, and is intended to distinguish the fault-mode-to-be-tested and the prior sample fault modes; h represents a serial number of the feature factors, $h=1, 2, \ldots, K+1$, and $s_{T,h}$ represents a $h^{th}$ feature factor of a voltage testable signal under the fault-mode-to-be-tested;

(6) computing a correlation coefficient matrix $R_i$ and correlation metric parameters $\delta_i$ between the feature factors of the fault-mode-to-be-tested and the feature factors of the prior sample fault modes all the fault modes $F_i$;

$$R_i = \begin{bmatrix} \rho_{11} & \rho_{12} & \cdots & \rho_{1(K+1)} \\ \rho_{21} & \rho_{22} & \cdots & \rho_{2(K+1)} \\ \vdots & \vdots & \vdots & \vdots \\ \rho_{(K+1)1} & \rho_{(K+1)2} & \cdots & \rho_{(K+1)(K+1)} \end{bmatrix},$$

$$\delta_i = \sum_{h=1}^{K+1} \left(\operatorname*{Max}_{d}(\rho_{hd})\right),$$

wherein $\rho_{hd} = E((s_{T,h} - E(s_{T,h})) \cdot (s_{i,d} - E(s_{i,d})))$, $i=1, 2, \ldots, N$, $E(\bullet)$ represents to determine an expected value, $s_{T,h}$ ($h=1, 2, \ldots, K+1$) represents the $h^{th}$ feature factor of the voltage testable signal under the fault-mode-to-be-tested, $s_{i,d}$ ($h=1, 2, \ldots, K+1$) represents the $d^{th}$ feature factor of the prior sample fault modes of the voltage sample signal under the fault mode $F_i$, the physical meaning of $\rho_{hd}$ is a correlation coefficient between the $h^{th}$ feature factor of the voltage testable signal under the fault-mode-to-be-tested and the $d^{th}$ feature factor of the prior sample fault modes of the voltage sample signal under the fault mode $F_i$;

$$\operatorname*{Max}_{d}(\rho_{hd})$$

represents the maximum $\rho_{hd}$ when h is constant and $d=1, 2, \ldots, (K+1)$; and (7) comparing all the $\delta_i$ and determining the fault-mode-to-be-tested of the analog circuit is a kth fault mode if $$k = \operatorname{Index}\left(\operatorname*{Max}_{i}(\delta_i)\right),$$

wherein i=1, 2, ..., N, and Index(•) represents to calculate an index.

2. The analog circuit fault diagnosis method using a single testable node according to claim 1, which characterized in, a feature of the K-layer orthogonal Haar wavelet analysis filter set in the step (3) is: each of layers of the filter set consists of a low-pass filter g(n) and a high-pass filter h(n), output portion of the high-pass filter h(n) is subjected to double downsampling to enter next layer of the wavelet filter set, and output of the low-pass filter g(n) at each layer is subjected to double downsampling and then outputted directly, the low-pass filter $g(n)=\{1/\sqrt{2}, 1/\sqrt{2}\}$, and the high-pass filter $h(n)=\{1/\sqrt{2}, 1/\sqrt{2}\}$.

3. The analog circuit fault diagnosis method using a single testable node according to claim 2, wherein a method of determining a layer number K of the K-layer orthogonal Haar wavelet analysis filter set in the step (3) comprises: setting an input signal of the filter set as $x=V_i$, wherein $V_i$ is the statistical average $$V_i = \sum_{j=1}^{M} V_{ij}/M$$

of the step (2), and setting the outputs of the high-pass filter h(n) and the low-pass filter g(n) at the layer K as $y_{K,H}$ and $y_{K,L}$ respectively;

(3.1) initializing: K=1, $\beta_0$=Th, wherein K is the layer number of filters, $\beta_0$ is an energy ratio threshold, and Th is a preset original value of the energy ratio threshold which can be any real number greater than 0 but less than 1;

(3.2) computing the energy ratio $$\beta = \frac{\langle y_{K,H}, y_{K,H} \rangle}{\langle x, x \rangle},$$

wherein <,> represents to compute an inner product; and (3.3) if $\beta > \beta_0$, then K=K+1, returning to execute the step (3.2); otherwise, outputting the layer number of filters K.

4. The analog circuit fault diagnosis method using a single testable node according to claim 1, wherein a method of extracting the feature factor by using the blind source processing technology in the step (4) is: setting a signal matrix needing to be processed by the blind source technology as $Y_i$, wherein an extracted feature factor matrix is $S_i=[s_{i,1}\ s_{i,2}\ \ldots\ s_{i,d}\ \ldots\ s_{i,(K+1)}]$, represents the $d^{th}$ feature factor of the prior sample fault mode under the fault mode $F_i$, and the dimensionalities of $Y_i$ and $S_i$ are equal;

(4.1) initializing a feature extracting matrix $W_0$ and an update step-length μ, and letting $W_1 \leftarrow W_0$, wherein "←" represents to assign the value of $W_0$ to $W_1$, $W_0$ is any unit matrix, and μ is a real number between (0, 0.3);

(4.2) computing: $S_i=W_0Y_i$;

(4.3) updating $W_1$: $W_1 \leftarrow W_0+\mu[I-f[S_i]]g^T[S_i]$, wherein forms of functions f(•) and g(•) herein are respectively $f[S_i]=S_i$ and $g[S_i]=S_i^3$, $g^T(•)$ represents matrix transposition; and I represents a standard unit matrix;

(4.4) standardizing $W_1$:

$$W_1 \leftarrow \frac{W_1}{\|W_1\|},$$

wherein ‖•‖ represents a matrix norm, $$\frac{W_1}{\|W_1\|}$$

represents to standardize $W_1$, and "←" represents to standardize $W_1$ and then assign a value to $W_1$; and (4.5) determining convergence: determining whether $W_1W_1^T \rightarrow I$, i.e., determining whether a product of $W_1W_1^T$ is infinitely approaching to I, "→" represents "infinitely approaching"; if yes, then outputting $S_i$; otherwise, $W_0 \leftarrow W_1$, wherein "←" represents assigning, and returning to the step (4.2); and I represents a standard unit matrix.

5. The analog circuit fault diagnosis method using a single testable node according to claim 1, wherein a method of determining a layer number K of the K-layer orthogonal Haar wavelet analysis filter set in the step (3) comprises: setting an input signal of the filter set as $x=V_i$, wherein $V_i$ is the statistical average $$V_i = \sum_{j=1}^{M} V_{ij}/M$$

of the step (2), and setting the outputs of the high-pass filter h(n) and the low-pass filter g(n) at the layer K as $y_{K,H}$ and $y_{K,L}$ respectively;

(3.1) initializing: K=1, $\beta_0$=Th, wherein K is the layer number of filters, $\beta_0$ is an energy ratio threshold, and Th is a preset original value of the energy ratio threshold which can be any real number greater than 0 but less than 1;

(3.2) computing the energy ratio $$\beta = \frac{\langle y_{K,H}, y_{K,H} \rangle}{\langle x, x \rangle},$$

wherein <,> represents to compute an inner product; and (3.3) if $\beta > \beta_0$, then K=K+1, returning to execute the step (3.2); otherwise, outputting the layer number of filters K.

* * * * *